United States Patent [19]

Thomas

[11] Patent Number: 5,091,048
[45] Date of Patent: Feb. 25, 1992

[54] ION MILLING TO OBTAIN PLANARIZATION

[75] Inventor: Michael E. Thomas, Milpitas, Calif.

[73] Assignee: National Semiconductor Corp., Santa Clara, Calif.

[21] Appl. No.: 583,832

[22] Filed: Sep. 17, 1990

[51] Int. Cl.⁵ .................. B44C 1/22; C03C 15/00; C03C 25/06
[52] U.S. Cl. .................. 156/643; 156/646; 156/657; 156/345; 204/192.34; 204/298.36
[58] Field of Search ........... 156/643, 646, 654, 655, 156/656, 657, 345; 204/192.34, 192.37, 298.36

[56] References Cited

U.S. PATENT DOCUMENTS

| | | | |
|---|---|---|---|
| 3,988,564 | 10/1976 | Garvin et al. | 204/192.34 X |
| 4,101,772 | 7/1978 | Konishi et al. | 204/192.34 X |
| 4,214,966 | 7/1980 | Mahoney | 204/192.34 |
| 4,460,434 | 7/1984 | Johnson et al. | 156/643 |
| 4,734,152 | 3/1988 | Geis et al. | 204/298.36 |
| 4,874,459 | 10/1989 | Coldren et al. | 156/643 |
| 4,986,876 | 1/1991 | Zeto et al. | 156/643 |

OTHER PUBLICATIONS

"Thin Film Processes", edited by John Vossen and Werner Kern, RCA Laboratories, David Sarnoff Research Center, Princeton, N.J., published by Academic Press, 1978, pp. 497-555.

Primary Examiner—William A. Powell
Attorney, Agent, or Firm—Irving S. Rappaport; William H. Murray; Frank M. Linguiti

[57] ABSTRACT

The surface of a semiconductor wafer is planarized by disposing the wafer in a wafer plane and rotating the wafer within the wafer plane wherein the rotation is around an axis perpendicular to the plane. A stream of particles is transported to the surface of the wafer while the wafer is rotating wherein the angle between the stream of particles and the wafer plane is small. The stream of particles mills the surface of the wafer thereby planarizing the surface of the wafer. The angle between the stream of particles and the wafer plane is preferably less than thirty degrees. The particles may be argon ions and may be chemically active particles or physical particles.

28 Claims, 2 Drawing Sheets

ION MILLING TO OBTAIN PLANARIZATION

BACKGROUND OF THE INVENTION

1. Field of The Invention

This invention relates to planarization of topographical features of integrated circuits and in particular to the use of ion bombardment to obtain multilevel interconnect dielectric planarization.

2. Background of the Invention

In the future, planarization will relax lithographic registration requirements and improve interconnect density. More importantly, it will relax the depth of field requirements since it is easier to maintain the sharpness of the topographical features when the surface is even. Furthermore, planarization relaxes overetch requirements in anisotropic metal etching. However, planarization which would introduce these advantages can not be achieved using, for example, resist etchback/SOG techniques. U.S. Pat. No. 4,670,091, issued to Thomas et al. on June 2, 1987, teaches a process performing vias for multilevel interconnects in integrated circuits wherein a conformal dielectric layer is formed by CVD or sputtering to cover interconnects and vias. The dielectric layer is then etched back to form a substantially planar surface. However methods such as these do not provide perfect planarization.

For example, the present methods of planarizing integrated circuit topologies do not planarize tightly pitched features well. Additionally, present processes do not planarize large and isolated features of integrated circuit topology very well. Finally, the present processes do not bring dielectric features to the same level over the entire surface of the wafer being planarized.

One reason for this is that the sacrificial fluids used in planarization are affected by the topographical density. In prior art methods, the sacrificial fluid is spun onto the silicon dioxide surface to be planarized. This method is effective for obtaining local planarization, but it is more satisfactory for planarizing some types of topographical features than others. Locally, effective planarization for leveling features on the order of five to ten microns is possible.

For example, this method does not effectively level large isolated finely pitched features. In tightly spaced features, the sacrificial fluid is held in the tight features by surface tension. Thus densely packed tightly pitched features get only an intermediate quality of planarization with respect to isolated features. Isolated features are planarized more poorly the tightly spared features. For example, a very thin layer of fluid accumulates over a fine line by itself in an open field. During the planarization the line may be exposed by etching. Thus it is very beneficial to generate a dielectric layer over all features wherein the dielectric layer is of uniform height at all points. However, there are still some problems with using this method to planarize large pads on the order of 120 microns in size. This problem arises because the wafer is spun after the sacrificial fluid is supplied to the surface of the wafer causing a varying and somewhat thicker level of the fluid in the center of a large pad compared to the thickness seen in a densely spaced region of fine features on the order of microns in size.

It is known in the art (IBM BSQ) to perform a topographical wafer planarization process wherein ions are directed to the surface of the topographical wafer at an angle of 90 degrees with respect to the wafer plane. This method achieves some degree of planarization. However, the edges of many of the topographical features of the wafers were knocked off by this process, exposing the underlying metal.

SUMMARY OF THE INVENTION

The surface of a semiconductor wafer is planarized by disposing the wafer in a wafer plane and rotating the wafer within the wafer plane wherein the rotation is around an axis perpendicular to the wafer plane. A stream of particles is applied to the surface of the wafer while the wafer is rotating wherein the angle between the stream of particles and the wafer plane is small. The stream of particles mills the surface of the wafer thereby planarizing the surface of the wafer by selective removal of high regions protruding from it.

DETAILED DESCRIPTION OF THE INVENTION

Figure 1:
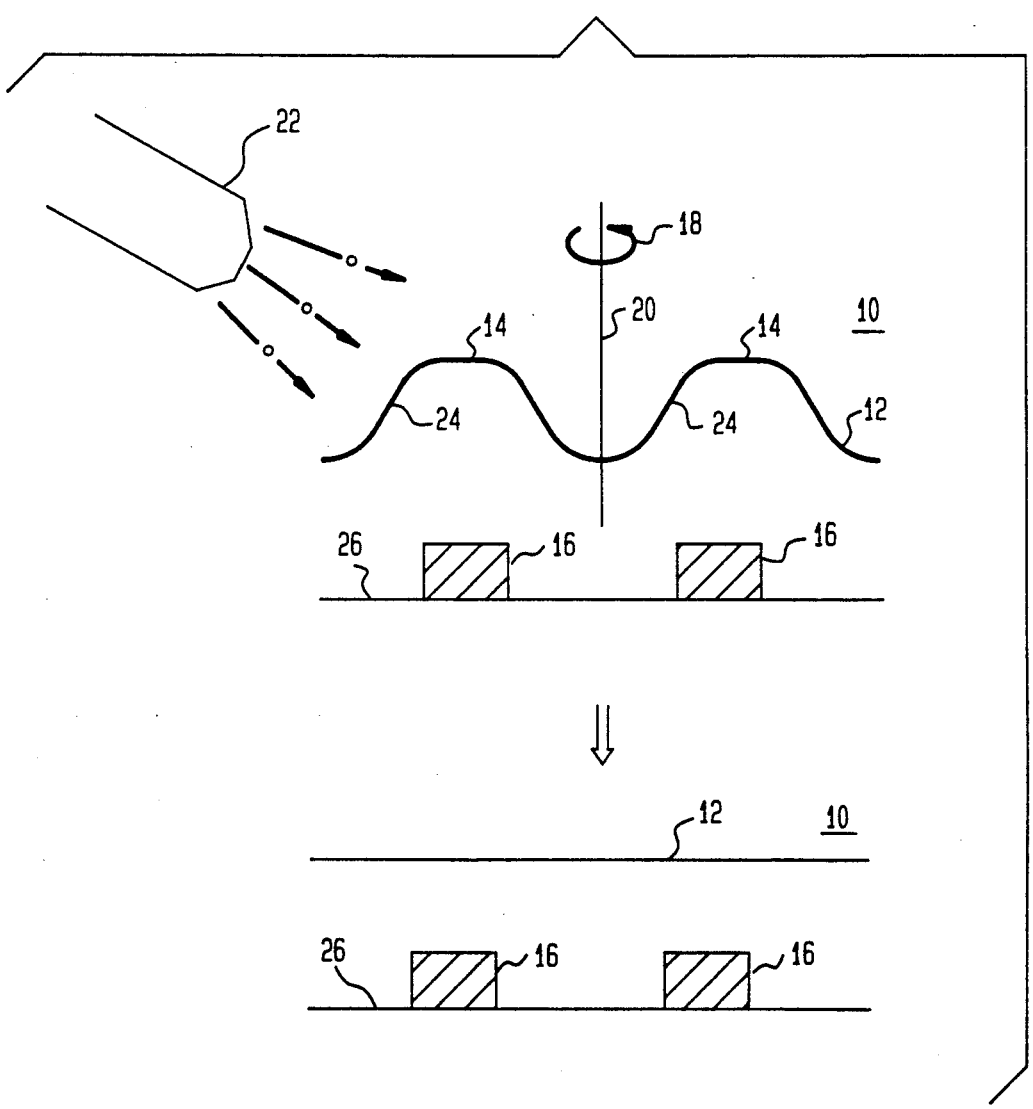
FIG. 1 shows a cross section of a wafer suitable for planarization using the method of the present invention both before and after the method of the present invention is performed.

Referring now to FIG. 1, there is shown a cross sectional representation of topographical wafer 10 suitable for planarization using the method of the present invention. Topographical wafer 10 includes two interconnects 16 over which layer 12 of silicon dioxide is deposited. When layer 12 of silicon dioxide is deposited over the surface of wafer 10, elevated or protruding topographical features 14 ar produced above interconnects 16 due to the conformal nature of the deposition process of layer 12. The conformal nature of the deposition causes irregular topography over the upper surface of silicon dioxide layer 12 upon topographical wafer 10.

In order to planarize the surface of silicon dioxide layer 12 upon topographical wafer 10, and thereby eliminate elevated topographical features 14 of layer 12, the surface of topographical wafer 10 is bombarded with particles, such as $Ar^+$ ions. The particles for bombarding the surface of silicon dioxide layer 12 of wafer 10 are transported from particle source 22 to the surface of wafer 10. During bombardment of topographical wafer 10 with particles from particle source 22 or ion source 22, wafer 10 may be rotated about axis 20 as indicated by arrow 18 in the preferred embodiment. The plane of rotation of topographical wafer 10 is parallel to plane 26. Axis of rotation 20 is perpendicular to plane 26. Thus the particle stream bombardment from particle source 22 is caused to fall evenly over the topographical surface of silicon dioxide layer 12 of wafer 10 during the planarization process. The average particle flux is therefore statistically averaged over the surface of impingement upon wafer 10.

After a period of time during which topographical wafer 10 is thus rotated about axis 20 and bombarded with particles from particle source 22, elevated topographical features 14 are removed from the surface of wafer 10. The removal of topographical features 14 is accomplished due to the particle bombardment of wafer 10 and planarization of the surface of silicon dioxide layer 12 is achieved by the removal of topographical features 14. Topographical features 14 are removed due to the relatively higher etch rate for surfaces of silicon dioxide layer 12 which protrude from or extend upwardly beyond the horizontal surface of layer 12. Because the protruding surfaces are etched at a faster rate than the horizontal surfaces, the protruding surfaces are eventually brought to substantially to the same level as the horizontal surfaces. This method can be advantageously applied to all high density VLSI devices with multiple metal interconnect levels.

It will be understood that topographical wafer 10 need not be rotated with respect to particle source 22. For example, particle source 22 may be rotated around a stationary topographical wafer 10. Any movement of particle source 22 with respect to topographical wafer 10 which causes the particle stream bombardment from particle source 22 to fall evenly over the topographical surface of wafer 10 may be used to eliminate elevated topographical features 14 of layer 12 provided that the flux of the particles is statistically averaged over the area of impingement. Additionally, a plurality of spaced apart symmetrically circularly arranged particle sources 22 may be provided in order to decrease or eliminate the amount of relative motion required.

Figure 2:
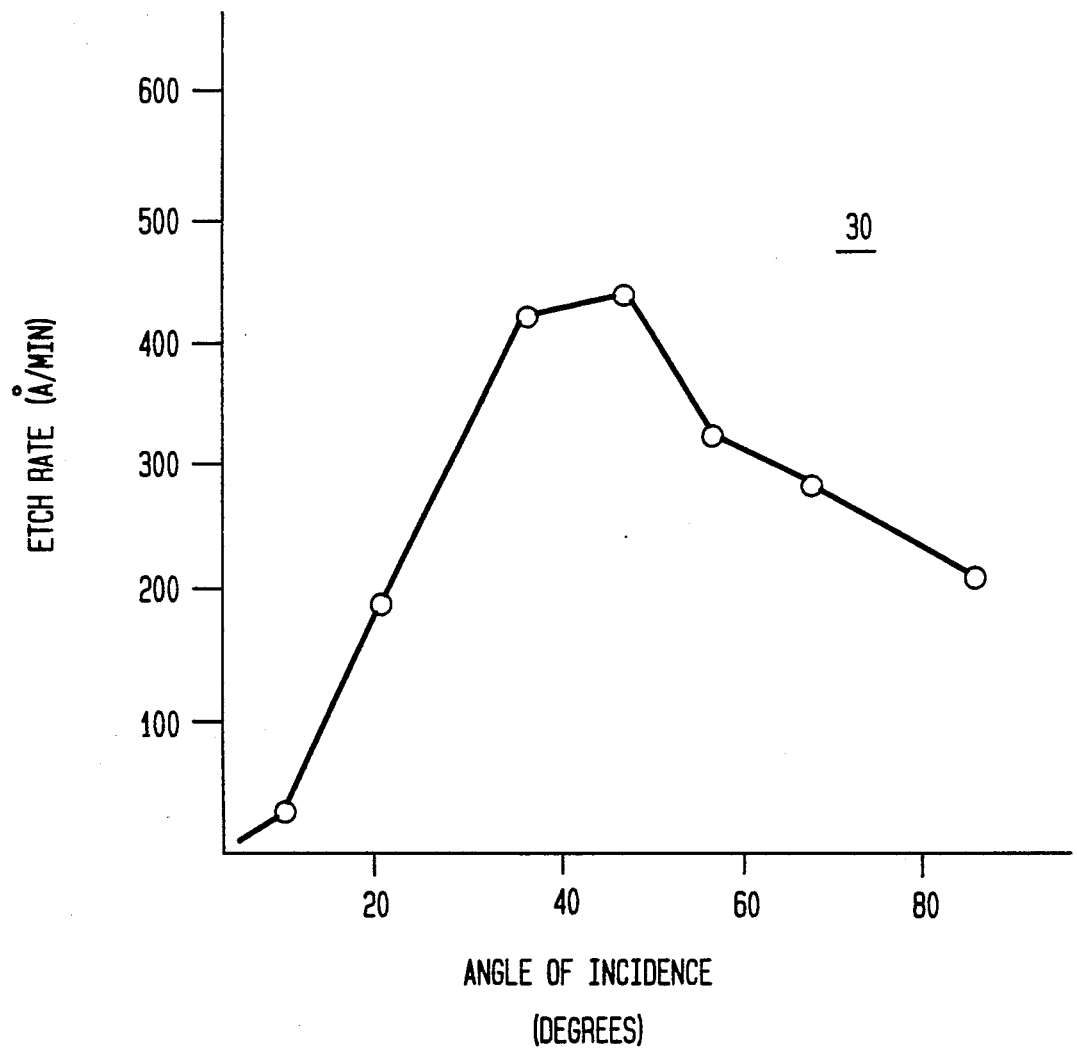
FIG. 2 shows a graphical representation of the relationship between the etch rate for a wafer such as that shown in FIG. 1 and the angle of incidence of particles transported to the surface of the wafer.

Referring now to FIG. 2, there is shown curve 30 which is a graphical representation of the relationship between the etch rate of the surface of silicon dioxide layer 12 of topographical wafer 10 and the angle of incidence of the bombardment with particles from particle source 22. The angle of incidence is defined as the angle between the particle stream from particle source 22 and wafer plane 26 of topographical wafer 10. For a very small angle of incidence of particles from particle source 22, the etch rate is very low. As the angle of incidence is increased, the etch rate increases substantially linearly until reaching a peak in the range of forty to fifty degrees. Thus to achieve good results an angle of incidence less than thirty degrees is preferred. After peaking, the etch rate begins to decrease as the angle of incidence is further increased.

The smaller the angle of incidence, the smaller the vertical component of the momentum as the particles strike the surface of topographical wafer 10. Therefore less momentum is delivered to horizontal surfaces of topographical wafer 10 being planarized at lower angles of incidence. Furthermore, with these smaller angles of incidence between topographical wafer 10 and the path of particles from particle source 22, the horizontal component of the momentum increases. The larger horizontal component causes greater momentum to be delivered to the vertical surfaces such as vertical surfaces 24 of elevated topological features 14 which form when silicon dioxide layer 12 is conformally deposited over interconnects 16.

Thus particles at smaller angles of incidence transfer greater momentum to the elevated features of the topology of wafer 10 than upon the level features because the elevated features, such as elevated topographical features 14, have more vertical surfaces than the rest of the topography cf wafer 10. The transfer of greater momentum to the elevated features of wafer 10 causes the removal of more material from the elevated features than from the horizontal surfaces of wafer 10. Likewise, less momentum is transferred to horizontal surfaces of topographical wafer 10 at lower angles of incidence and therefore less material is removed from the surfaces at lower angles.

In combination with the results graphically represented by curve 30, wherein smaller angles of incidence produce lower etch rates, it will be understood by those skilled in the art that small angles of incidence are preferred in practicing the method of the present invention. The smaller angles remove elevated features having vertical surfaces while simultaneously removing relatively little of the flat horizontal surfaces of topographical wafer 10. Thus applying small particles at an oblique angle to the rough topographical surface of a wafer such as topographical wafer 10 can generate smoothing by a planing action. This method avoids contamination problems which may be caused by abrasive particles used in a mechanical planarization process.

The preferred size of a particle from particle source 22 for bombarding the surface of topographical wafer 10 in practicing the method of the present invention is approximately four angstroms. The method of the present invention may provide argon ions from ion source 22 to bombard the surface of topographical wafer 10. It will be understood by those skilled in the art that the particles used to bombard topographical surface 10 may also be a chemically active ionic species such as $CF_4/O_2$, $CHF_3$, or $O_2$. These chemically reactive ions may be accelerated toward the surface of topographical wafer 10 to cause planarization of the surface of topological wafer 10.

For example, the ions may be electrically biased and disposed in an electrical field in order to accelerate them toward the surface of topographical wafer 10. This causes the chemically active ionic species to planarize topographical wafer 10 both by 1) the physical sputtering component previously described with respect to bombardment with argon ions, as well as 2) a chemical component wherein the impinging particles from particle source 22 chemically react with the surface of topographical wafer 10.

It will be understood by those skilled in the art that an electrical field may be used to accelerate other types of particles to the surface of topographical wafer 10. Additionally, high velocity particles, such as colloidal silica in a fluid such as water, may be used as a water jet to mill the surface of topographical wafer 10 provided there is a cohesive force to hold the particles in a stream. In a water jet stream the particles for planarizing the surface of topographical wafer 10 may be held in the stream by the viscosity of the water.

It will be understood that various changes in the details, materials and arrangement of the parts which have been described and illustrated in order to explain the nature of this invention, may be made by those skilled in the art without departing from the principle and scope of the invention as expressed in the following claims.

What is claimed:

1. A method for planarizing a topographical semiconductor device formed of semiconductor device material disposed in a semiconductor device plane and having elevated topographical features extending beyond the surface of said semiconductor device, comprising the steps of:

providing particles from a particle source, and
transporting said particles to said semiconductor device at an angle of incidence of said transported particles with respect to said semiconductor device plane less than approximately thirty degrees thereby removing said material from said elevated topographical features at a faster rate than from said surface to mill said semiconductor device by means of said transported particles.

2. The method for planarizing a topographical semiconductor device of claim 1, wherein said angle of incidence of said transported particles with respect to said device plane is between approximately ten degrees and approximately thirty degrees.

3. The method for planarizing a topographical semiconductor device of claim 1, wherein said particles are transported substantially evenly over said topographical semiconductor device to average the particle flux over said semiconductor device.

4. The method for planarizing the surface of a topographical semiconductor device of claim 1, comprising the further step of moving said semiconductor device with respect to said particle source.

5. The method for planarizing a topographical semiconductor device of claim 4, wherein the step of moving said semiconductor device with respect to said particle source comprises rotating said semiconductor device within said device plane while transporting said particles from said particle source to said semiconductor device.

6. The method for planarizing a topographical semiconductor device of claim 4, wherein the stop of moving said semiconductor device with respect to said particle source comprises rotating said particle source over said semiconductor device.

7. The method for planarizing the surface of a topographical semiconductor device of claim 1, comprising the further step of providing particles from a plurality of circularly symmetrically arranged particle sources.

8. The method for planarizing the surface of a topographical semiconductor device of claim 1, wherein said transporting of said particles from said particle source comprises transporting ionic particles in an ion beam.

9. The method for planarizing the surface of a topographical semiconductor device of claim 8, wherein said ionic particles comprise argon ions.

10. The method for planarizing a topographical semiconductor device of claim 1, wherein said transporting of said particles comprises transporting a chemically active species.

11. The method for planarizing a topographical semiconductor device of claim 10, wherein said transporting of said chemically particles comprises transporting chemically active ionic particles.

12. The method for planarizing a topographical semiconductor device of claim 10, wherein said transporting of said chemically active particles comprises transporting a fluorocarbon.

13. The method for planarizing a topographical semiconductor device of claim 12, wherein said transported fluorocarbon is selected from the group consisting of $CF_4$, $CHF_3$, and $C_2F_6$.

14. The method for planarizing a topographical semiconductor device of claim 10, wherein said chemically reactive species is electrically biased and accelerated towards said semiconductor device by an electrical field.

15. A semiconductor integrated circuit fabrication device for planarizing a topographical semiconductor device formed of semiconductor device material, said semiconductor device disposed in a device plane and having elevated topographical features extending beyond the surface of said semiconductor device, comprising:

particle source means for providing a supply of particles, and means for transporting said particles to said semiconductor device at an angle of incidence of said transported particles with respect to said semiconductor device plane less than approximately thirty degrees thereby removing said material from said elevated topographical features at a faster rate than from said surface to mill said said semiconductor device by means of said transported particles.

16. The fabrication device for planarizing a topographical semiconductor device of claim 15, wherein said means for transporting said particles comprises means for transporting particles at an angle of incidence of said transported particles with respect to said wafer plane between approximately ten degrees and approximately thirty degrees.

17. The fabrication device for planarizing a topographical semiconductor device of claim 15, wherein particles from said particle source means are transported substantially evenly over said topographical semiconductor device to average the particle flux over said semiconductor device.

18. The fabrication device for planarizing a topographical semiconductor device of claim 15, further comprising means for moving said semiconductor device with respect to said particle source means.

19. The fabrication device for planarizing a topographical semiconductor device of claim 18, wherein said means for moving said semiconductor device with respect to said particle source means comprises means for rotating said semiconductor device within said wafer plane while transporting said particles from said particle source means to said semiconductor device.

20. The fabrication device for planarizing a topographical semiconductor device of claim 18, wherein said means for moving said semiconductor device with respect to said particle source means comprises means for rotating said particle source means over said semiconductor device.

21. The fabrication device for planarizing a topographical semiconductor device of claim 15, wherein said particle source means for providing a supply of particles comprises a plurality of circularly symmetrically arranged particle sources.

22. The fabrication device for planarizing a topographical semiconductor device of claim 15, wherein said transported particles from said particle source means comprise ionic particles transported in an ion beam.

23. The fabrication device for planarizing a topographical semiconductor device of claim 22, wherein said transported ionic particles from said particle source means comprise argon ions.

24. The fabrication device for planarizing a topographical semiconductor device of claim 15, wherein said transported particles from said particle source means comprise a chemically active species.

25. The fabrication device for planarizing a topographical semiconductor device of claim 24, wherein said transported chemically active species comprise ionic chemically active species.

26. The fabrication device for planarizing a topographical semiconductor device of claim 24, wherein said chemically active species comprise a fluorocarbon.

27. The fabrication device for planarizing a topographical semiconductor device of claim 26, wherein said fluorocarbon is selected from the group consisting of $CF_4$, $CHF_3$, and $C_2F_6$.

28. The fabrication device for planarizing a topographical semiconductor device of claim 24, wherein said chemically reactive species is electronically biased and accelerated towards said semiconductor device by an electrical field.

* * * * *

UNITED STATES PATENT AND TRADEMARK OFFICE
CERTIFICATE OF CORRECTION

PATENT NO. : 5,091,048

DATED : February 25, 1992

INVENTOR(S) : Michael E. Thomas

It is certified that error appears in the above-identified patent and that said Letters Patent is hereby corrected as shown below:

Column 2, line 38, "ar" should be corrected to read --are--.

Column 3, line 61, "cf" should be corrected to read --of--.

Column 5, line 24 (claim 6, line 2), the word "stop" should be corrected to read --step--.

Column 5, line 29 (claim 7, line 1), the words "the surface of" should be deleted.

Column 5, line 33 (claim 8, line 1), the words "the surface of" should be deleted.

Column 5, line 38 (claim 9, line 1), the words "the surface of" should be deleted.

Column 5, line 47 (claim 11, line 3), the word --active-- should be inserted between the words "chemically" and "particles".

Signed and Sealed this

Thirteenth Day of July, 1993

*Attest:*

MICHAEL K. KIRK

*Attesting Officer*     *Acting Commissioner of Patents and Trademarks*